(12) United States Patent
Liaw et al.

(10) Patent No.: US 6,214,698 B1
(45) Date of Patent: Apr. 10, 2001

(54) SHALLOW TRENCH ISOLATION METHODS EMPLOYING GAP FILLING DOPED SILICON OXIDE DIELECTRIC LAYER

(75) Inventors: Jhon-Jhy Liaw, Taipei; Jin-Yuan Lee, Hsin-Chu; Kuei-Ying Lee, Chu-Dong; Chu-Yun Fu, Taipei; Kong-Beng Thei, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/480,270

(22) Filed: Jan. 11, 2000

(51) Int. Cl.[7] ....................................... H01L 21/76
(52) U.S. Cl. .................. 438/435; 438/424; 438/430; 438/433; 438/434; 438/435; 257/520; 257/521
(58) Field of Search ..................... 438/435, 433, 438/434, 424, 430; 257/397, 520, 521

(56) References Cited

U.S. PATENT DOCUMENTS

| | | | |
|---|---|---|---|
| 4,506,435 | * 3/1985 | Pliskin et al. ..................... 29/576 W |
| 4,740,480 | * 4/1988 | Ooka ...................................... 437/61 |
| 5,099,304 | * 3/1992 | Takemura et al. ..................... 357/49 |
| 5,225,358 | * 7/1993 | Pasch ..................................... 437/33 |
| 5,674,773 | * 10/1997 | Koh et al. .............................. 437/60 |
| 5,741,740 | * 4/1998 | Jang et al. ............................ 438/435 |
| 5,811,345 | * 9/1998 | Yu et al. ............................... 438/424 |
| 5,902,127 | * 5/1999 | Park ...................................... 438/435 |
| 5,960,300 | * 9/1999 | Yabu et al. ........................... 438/436 |
| 5,963,840 | * 10/1999 | Xia et al. ............................. 438/783 |
| 5,976,947 | * 11/1999 | Reinberg ............................. 438/424 |
| 5,989,977 | * 11/1999 | Wu ....................................... 438/431 |

\* cited by examiner

Primary Examiner—Matthew Smith
Assistant Examiner—Granvill D. Lee, Jr.
(74) Attorney, Agent, or Firm—George O. Saile; Stephen B. Ackerman; Stephen G. Stanton

(57) ABSTRACT

A method for filling a trench within a substrate. First a substrate is provided having a trench formed therein. The trench has a bottom surface and opposing side walls. An undoped silicon glass liner is then thermally grown to coat the bottom surface and side walls of the trench. An undoped silicon oxide layer is then deposited over the undoped silicon glass liner. A boron doped silicon oxide layer is then deposited over the undoped silicon oxide layer, filling the trench. The boron doped silicon oxide layer is then heated to reflow the boron doped silicon oxide to fill any void initially formed within the boron doped silicon oxide layer within the trench, thereby eliminating any void so formed.

37 Claims, 2 Drawing Sheets

SHALLOW TRENCH ISOLATION METHODS EMPLOYING GAP FILLING DOPED SILICON OXIDE DIELECTRIC LAYER

FIELD OF THE INVENTION

The present invention relates generally to methods for forming trench fill layers in shallow trench isolation (STI) trenches within substrates employed in integrated circuit (IC) fabrication. More particularly, the present invention relates to methods for forming gap filling sub-atmospheric pressure chemical vapor deposition (SA-CVD) doped silicon oxide trench fill layers within shallow trench isolation trenches within substrates employed in integrated circuit fabrication to eliminate voids that may be formed in narrow trenches or those with nearly vertical side walls when filling with dielectric material.

BACKGROUND OF THE INVENTION

Integrated circuits are formed from semiconductor substrates, usually silicon (Si), within and upon whose surfaces are formed active semiconductor regions containing electrical circuit elements that are internally and externally connected to the substrate through multiple patterned conductor layers that are separated by dielectric layers. These active semiconductor regions must be otherwise electrically isolated from adjacent active semiconductor regions by the formation of intervening trenches which are subsequently filled with dielectric material to ensure such electrical isolation and avoid undesired interference between adjacent active semiconductor regions. The continued miniaturization of integrated circuit devices has resulted in smaller trenches formed by, for example, shallow trench isolation (STI) methods to form trench isolation regions essentially co-planar with adjacent active semiconductor regions of the semiconductor substrates.

As noted in U.S. Pat. No. 5,741,740 to Jang et al., it has been found that filling these isolation trenches with gap filling silicon oxide layers through ozone assisted sub-atmospheric pressure thermal chemical vapor deposition methods produce superior results as the silicon oxide layers typically possess the inherently superior gap filling characteristics desirable for trenches of limited dimensions usually present in advanced integrated circuit fabrication.

However, for these increasingly miniaturized integrated circuits with corresponding miniaturized shallow isolation trenches having a width of less than about 0.26 microns, or side walls that are greater than about 80° vertical, an undesired void, or keyhole, is formed within the gap filling silicon oxide layer within the trench. It is easy to form an overhead at the top corners of shallow trenches using traditional CVD-ox (chemical vapor deposition of silicon oxide) to gap filling and thus voids are formed. Void defects may trap contamination or make the final oxide surface of the STI (shallow trench isolation region) lower than the active surface. Also, junction leakage would increase.

For example, U.S. Pat. No. 4,506,435 to Pliskin et al. describes first lining the trench with a silicon oxide lining then filling the trench with, for example, a borosilicate glass. The borosilicate glass layer is heated, causing it to soften and flow to approach planarity. Then the borosilicate glass layer and SiN mask layer are etched to make the borosilicate glass filled trench substantially planar with the SiO masking layer.

U.S. Pat. No. 5,099,304 to Takemura describes a STI fill process that: lines the trench with a silicon oxide lining; forming a silicon nitride (SiN) film over the silicon oxide lining; building a polycrystal silicon film over the SiN film; etching back the polycrystal silicon film below the surface of the semiconductor substrate; then filling the trench with a boron phosphorus doped CVD silicon glass (boron phosphosilicate). The boron phosphorus doped silicon oxide is heated to allow the boron phosphorus doped silicon glass (BPSG) to reflow and make the surface thereof flat. A silicon oxide film, e.g. a boron phosphosilicate glass film is built up by a low pressure CVD method over the semiconductor substrate to make an even flatter surface.

U.S. Pat. No. 4,740,480 to Ooka describes a BPSG isolation fill layer that is fused to flow and reflow to make a smoothly contoured or round surface.

U.S. Pat. No. 5,225,358 to Pasch describes a method where a BPSG layer forms both the STI oxide, filling the trench(es), and the inter level dielectric (ILD) layer after the transistor fabrication process. The BPSG layer is planarized by chemical mechanical polishing (CMP).

U.S. Pat. No. 5,811,345 to Yu et al. describes a SA-CVD-OX trench fill process with an ozone-TEOS layer over a phosphorus doped silicon oxide layer. The ozone-TEOS layer is lowered by a wet dip in HF solution then planarized by plasma etching down to the phosphorus doped silicon oxide layer without CMP being used.

SUMMARY OF THE INVENTION

Accordingly, it is an object of the present invention to use doped silicon glass to reflow into voids or keyholes in shallow trench oxides.

Another object of the present invention to use boron-doped silicon glass to reflow into voids or keyholes in shallow trench oxides.

A further object of the present invention is to use three layers to fill a trench, the first layer being a thermal silicon glass liner, the second layer being an undoped SA-CVD (sub-atmosphere chemical vapor deposition) silicon oxide layer, and the third layer being a boron-doped SA-CVD silicon glass layer.

Yet another object of the present invention is to use three layers to fill a trench, the first layer being a thermal silicon glass liner, the second layer being an in-situ deposited undoped SA-CVD silicon oxide layer, and the third layer being an in-situ boron doped SA-CVD silicon glass layer An additional object of the present invention is to use low content boron (B)-doped SA-CVD oxide to reflow into voids or keyholes in shallow trench oxides to get better gap filling capability than undoped SA-CVD oxide or phosphorus (P)-doped SA-CVD oxide and in that low content B could prevent the B from penetrating to the trench sidewall.

Other objects will appear hereinafter.

It has now been discovered that the above and other objects of the present invention may be accomplished in the following manner. Specifically, in a substrate, for example a semiconductor silicon substrate, having a trench with a bottom surface and side walls, undoped silicon glass (USG) liner is grown in the trench to coat the bottom and side walls of the trench with a layer of the USG preferably by a thermal process with the following parameters: from about 800 to 1100° C. This USG liner has a thickness of from about 150 to about 350 Å, and is more preferably 250 Å thick. An undoped silicon oxide layer is then deposited over the undoped silicon glass liner preferably by an SA-CVD process with the following parameters: at about: 60 Torr; a spacing of about 300 mils; about 480° C.; about 5500 sccm $O_3$; about 480 mgm (milligrams per minute) TEOS; and at about 4000 sccm He. The undoped silicon oxide layer has a thickness of from about 300 to about 500 Å, and is more preferably 400 Å thick.

A low boron doped silicon oxide is then deposited, preferably by an SA-CVD method, over the undoped silicon oxide layer, filling the trench and covering the surface of the semiconductor integrated circuit. The boron doped silicon oxide layer has a thickness of from about 2500 to about 4500 Å, and is more preferably 3500 Å thick. The boron concentration is from about 2 wt. % to 5 wt. % and more preferably from about 2 wt. % to 3 wt. %. In trenches formed by STI methods having a width of less than about 0.26 microns and/or side walls greater than about 83° vertical, an undesired void or keyhole may be formed within the boron doped silicon oxide layer within the trench. The boron doped silicon oxide layer (B-OX) is then heated to reflow the boron doped silicon oxide into the void, filling and eliminating the void. The B-OX layer is then planarized, preferably by chemical mechanical polishing, CMP, to render the B-OX layer co-planar with the active semiconductor regions within the substrate.

BRIEF DESCRIPTION OF THE DRAWINGS

For a more complete understanding of the invention, reference is hereby made to the drawings, in which.

DETAILED DESCRIPTION OF THE PREFERRED EMBODIMENT

Figure 1:
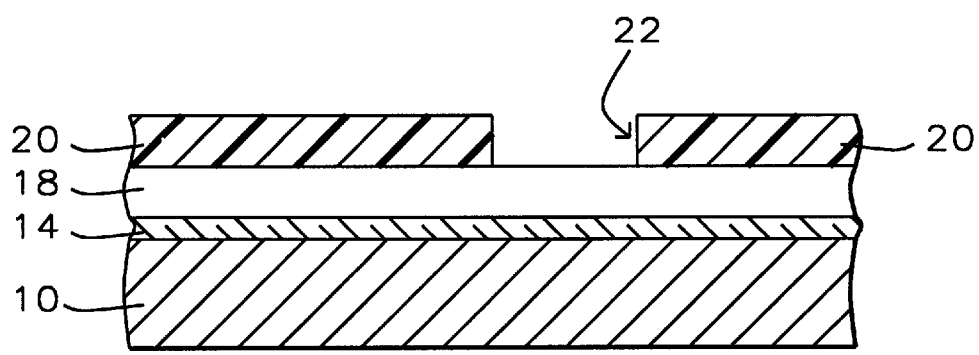
FIGS. 1 to 5 show a series of schematic cross-sectional diagrams illustrating the results of progressive stages in forming within an isolation trench, within a semiconductor substrate employed in integrated circuit fabrication, a patterned planarized gap filling low boron doped silicon oxide trench fill layer while eliminating any void or keyhole initially formed within the low boron doped silicon oxide trench fill layer, in accordance with a preferred embodiment of the method of the present invention.

Accordingly as shown in FIG. 1, a pad oxide layer 14, that is from about 100 to 300 Å thick and more preferably 100 Å thick, is formed over a substrate 10 by any known suitable method. The substrate 10 may be a semiconductor substrate and be composed of silicon. Next a barrier layer 18 is formed over the pad oxide layer 14. The barrier layer 18 is preferably silicon nitride, $Si_3N_4$ or commonly just SiN, and is from about 1,000 to 2,500 Å thick and more preferably 1700 Å thick. The SiN barrier layer may also be a polish stop during CMP as herein described. A photoresist layer 20 is then formed over the barrier layer 18. The photoresist layer 18 is exposed and developed to form openings 22 over isolation regions in the substrate. The barrier layer 18, pad oxide layer 14, and substrate 10 are then etched in the defined isolation areas to form a trench 24. Trench 24 may be an isolation trench in a semiconductor substrate 10 that separates and isolates the active semiconductor regions in the semiconductor substrate 10. Trench 24 may be from about 2500 Å to about 4500 Å deep, and more preferably 3500 Å deep. The photoresist layer 20 is then removed. These steps may be performed by various conventional methods and equipment well known in the art.

In the past, the method used by the inventors to improve gap filling capability involved a high temperature, that is from about 400° C. to about 500° C. and more preferably 480° C., SA-CVD method to deposit silicon oxide within the trench. However, the inventors have found that for trenches with a width of less than about 0.26 microns or side walls that are greater than about 80° vertical, an undesired void or keyhole 32 forms in the fill layer within the trench. Any void will induce a poly short at the following step. The inventors have discovered that the use of low boron doped SA-CVD silicon oxide as a trench fill material instead of just silicon oxide is admirably suited to eliminating the void 32 as further described herein.

The isolation trench 24 is a shallow isolation trench having a width "w" preferably about 0.25 microns and more preferably about 0.26 microns, and a depth "d" of from about 2500 to about 4500 microns and more preferably 3500 microns. The width "w" may be less than 0.25 microns. The side walls of the isolation trench 24 are from about 75° to about 85° vertical and more preferably greater than about 83° vertical.

Figure 2:
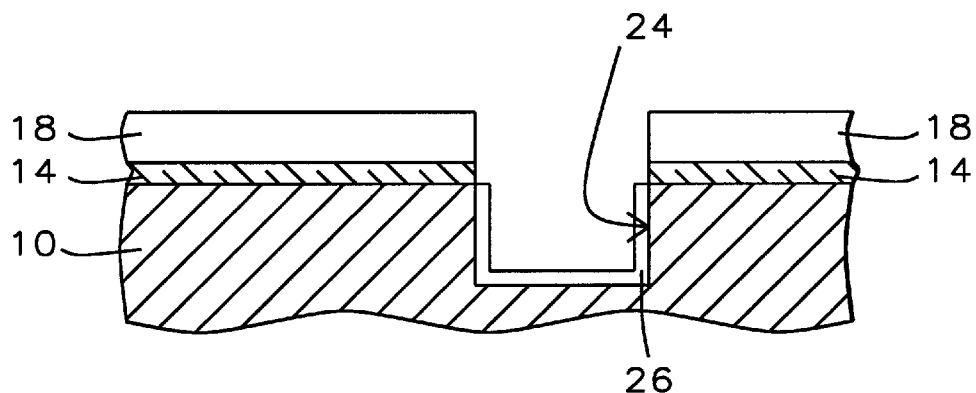

As shown in FIG. 2, an undoped silicon glass liner 26 is then deposited to cover the bottom and side walls of trench 24. The silicon glass liner 26 is formed by a thermal process at the following conditions: from about 800 to 1100° C. with an $O_2/N_2$ ratio from about 0.1 to 0.5; and has a thickness of between about 150 to 350 Å with a preferred thickness of 250 Å.

Figure 3:
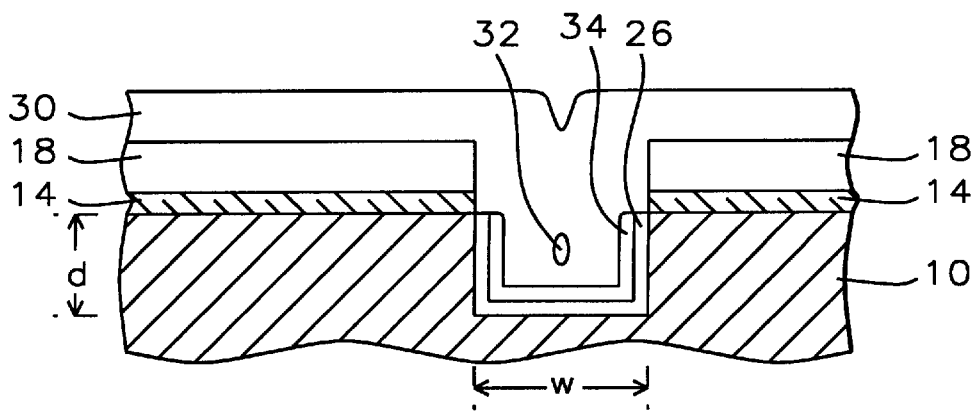

As shown in FIG. 3, an undoped silicon oxide layer 34 is then deposited over the silicon glass liner 26. The undoped silicon oxide layer 34 is formed by a CVD process at the following conditions: at about: 60 Torr; 300 mils; 480° C.; 5500 sccm $O_3$; 480 mgm TEOS; and 4000 sccm He; and has a thickness of between about 150 Å to about 350 Å with a preferred thickness of 250 Å.

Undoped silicon oxide layer 34 prevents B penetration with less thermally grown oxide. Less thermally grown oxide has less stress around the trench.

Then a low boron doped silicon oxide layer 30 is deposited over the undoped silicon oxide layer 34 and filling trench 24 and covering the surface of the semiconductor integrated circuit and possibly forming a void, or keyhole, 32 within the filled trench especially for trenches having a width "w" of less than about 0.26 microns or having side walls that are greater than about 80° vertical. B-doped silicon oxide is better than P-doped silicon oxide for the present invention although BPSG (boron phosphorus silicon glass) may also work.

The boron doped silicon oxide layer 30 has a thickness of between about 3000 to 5000 Å with a preferred thickness of 4000 Å with a boron concentration of from about 2 to 5% and more preferably from about 2 to 3%.

The low boron doped silicon oxide layer 30 is formed by a SA-CVD process at the following conditions using an AMAT DXZ or lamp heated chamber:

a reactor chamber pressure between about 150 and 250 Torr and more preferably about 200 Torr;

a silicon semiconductor substrate temperature between about 400 and 500° C. and more preferably about 480° C.;

boron carrier gas flow rate between about 60 and 90 sccm and more preferably about 70 sccm;

ozone concentration between about 12 and 13 weight percent in oxygen carrier gas and more preferably 12.5 wt. %; and a TEOS flow rate of from about 450 to 550 mgm (milligrams per minute) in an helium carrier gas with a flow rate of between 5000 and 7000 sccm and more preferably about 6000 sccm; and a electrode spacing of from about 200 to 250 mils.

Figure 4:
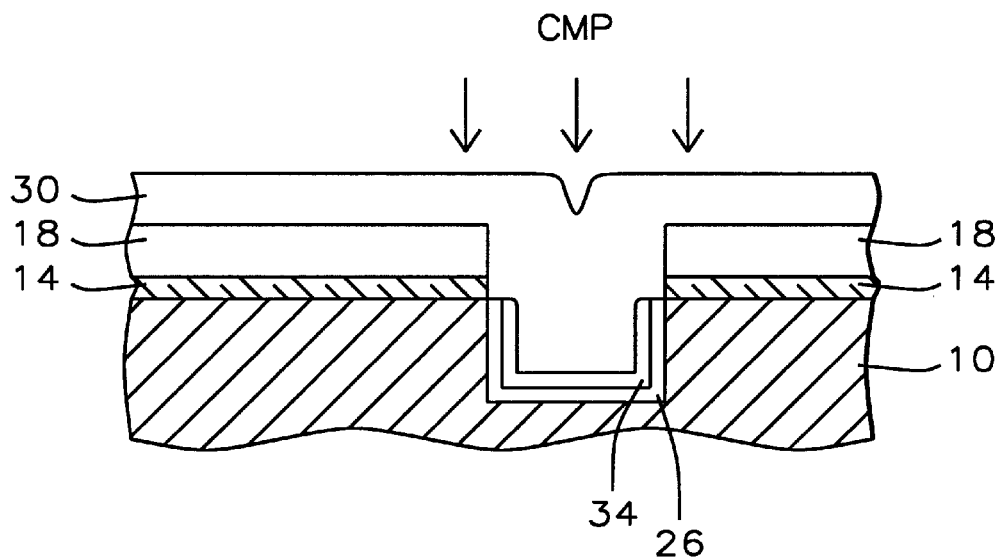

The boron doped silicon oxide layer 30 shown in FIG. 3 is then heated to reflow into any void 32 so formed, filling any void 32 and eliminating it as shown in FIG. 4. The heating of the boron doped silicon oxide layer 30 comprises heating at a temperature of between about 950° C. to 1,100° C. and more preferably 1,000° C. in an nitrogen atmosphere for a time between about 1 to 3 hours, and more preferably 2 hours.

Figure 5:
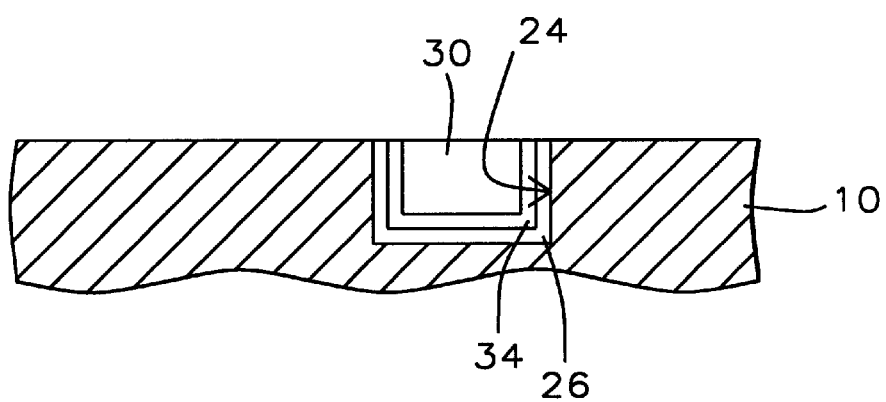

The low boron doped oxide layer 30 shown in FIG. 4 may then be planarized by, for example, CMP or etch back. to form a planarized gap filling low boron doped silicon oxide layer trench filled layer as shown in FIG. 5. The SiN barrier layer 18 may function as a polish stop.

While particular embodiments of the present invention have been illustrated and described, it is not intended to limit the invention, except as defined by the following claims.

We claim:

1. A method for filling a trench within a substrate, the steps comprising:

providing a substrate having a trench formed therein, said trench having a bottom surface and opposing side walls;

growing an undoped silicon glass liner to coat said bottom surface and side walls of said trench;

depositing an undoped silicon oxide layer over said undoped silicon glass liner;

depositing a boron doped silicon oxide layer over said undoped silicon oxide layer and filling said trench; then heating said boron doped silicon oxide layer to reflow said boron doped silicon oxide to fill any void initially formed within said boron doped silicon oxide layer within said trench, thereby eliminating any said void.

2. The method of claim 1, further including the step of then planarizing said boron doped silicon oxide layer to form within said trench a planarized gap filling boron doped silicon oxide trench filled layer.

3. The method of claim 2, wherein said planarizing is chemical mechanical polishing.

4. The method of claim 1, wherein said substrate is a semiconductor substrate and said trench is an isolation trench within said semiconductor substrate.

5. The method of claim 1, wherein said substrate is a semiconductor substrate and said trench is an isolation trench within said semiconductor substrate, wherein said substrate is a silicon substrate.

6. The method of claim 1, wherein the concentration of boron in said boron doped silicon oxide layer is between about from 2 wt. % to about 5 wt. %.

7. The method of claim 1, wherein said substrate is a semiconductor substrate and said trench is an isolation trench within said semiconductor substrate, wherein said isolation trench is a shallow isolation trench having a width of less than about 0.26 microns and a depth of from about 0.25 to about 0.4 microns.

8. The method of claim 1, wherein said substrate is a semiconductor substrate and said trench is an isolation trench within said semiconductor substrate, wherein said isolation trench is a shallow isolation trench having a width of about 0.26 microns and a depth of from about 0.25 to about 0.4 microns, wherein said side walls of said isolation trench are from about 75° to about 85° vertical.

9. The method of claim 1, wherein said substrate is a semiconductor substrate and said trench is an isolation trench within said semiconductor substrate, wherein said isolation trench is a shallow isolation trench having a width of less than about 0.25 microns and a depth of from about 0.25 to about 0.45 microns, wherein said shallow isolation trench has a top width of less than 0.26 microns.

10. The method of claim 1, wherein said substrate is a semiconductor substrate and said trench is an isolation trench within said semiconductor substrate, wherein said isolation trench is a shallow isolation trench having a width of about 0.25 microns and a depth of from about 0.25 to about 0.45 microns, wherein said shallow isolation trench has a top width of less than about 0.26 microns, wherein said side walls of said isolation trench are greater than about 83° vertical.

11. The method of claim 1, wherein said undoped silicon glass liner has a thickness of from about 350 to about 500 Å.

12. The method of claim 1, wherein said undoped silicon glass liner has a thickness of from about 250 to about 500 Å, wherein said undoped silicon oxide layer has a thickness of less than about 500 Å.

13. The method of claim 1, wherein said heating is from about 950° C. to about 1,100° C. for about 1 hour to about 3 hours.

14. The method of claim 1, wherein said undoped silicon glass liner has a thickness of from about 250 to about 500 Å, wherein said undoped silicon oxide layer has a thickness of less than about 500 Å, wherein said heating is at about 1,000° C. for about 2 hours.

15. A method for filling a isolation trench within a silicon semiconductor substrate, the steps comprising:

providing a silicon semiconductor substrate having an isolation trench formed therein, said isolation trench having a bottom surface and opposing side walls;

thermally growing an undoped silicon glass liner to coat said bottom surface and side walls of said isolation trench;

depositing an undoped silicon oxide layer over said undoped silicon glass liner;

depositing a boron doped silicon oxide layer over said undoped silicon oxide layer and filling said isolation trench;

heating said boron doped silicon oxide layer to reflow said boron doped silicon oxide to fill any void initially formed within said boron doped silicon oxide layer within said isolation trench, thereby eliminating any said void; then planarizing said boron doped silicon oxide layer to form within said trench a planarized gap filling boron doped silicon oxide trench filled layer.

16. The method of claim 15, wherein the concentration of boron in said boron doped silicon oxide layer is between about from 2 wt. % to about 5 wt. %.

17. The method of claim 15, wherein said isolation trench is a shallow isolation trench having a width of less than about 0.26 microns and a depth of from about 0.25 to about 0.4 microns.

18. The method of claim 15, wherein said isolation trench is a shallow isolation trench having a width of about 0.26 microns and a depth of from about 0.25 to about 0.4 microns, wherein said opposing side walls of said isolation trench are from about 75° to about 85° vertical.

19. The method of claim 15, wherein said isolation trench is a shallow isolation trench having a width of less than about 0.25 microns and a depth of from about 0.25 to about 0.45 microns, wherein said shallow isolation trench has a top width of less than about 0.26 microns.

20. The method of claim 15, wherein said isolation trench is a shallow isolation trench having a width of about 0.25 microns and a depth of from about 0.25 to about 0.45 microns, wherein said shallow isolation trench has a top width of less than about 0.26 microns, wherein said opposing side walls of said isolation trench are greater than about 83° vertical.

21. The method of claim 15, wherein said undoped silicon glass liner has a thickness of from about 350 to about 500 Å.

22. The method of claim 15, wherein said undoped silicon glass liner has a thickness of from about 250 to about 500 Å and said undoped silicon oxide layer has a thickness of less than about 500 Å.

23. The method of claim 15, wherein said heating is from about 950° C. to about 1,100° C. for about 1 hour to about 3 hours.

24. The method of claim 15, wherein said undoped silicon glass liner has a thickness of from about 250 to about 500 Å, said undoped silicon oxide layer has a thickness of less than about 500 Å, and said annealing is at about 1,000° C. for about 2 hours.

25. The method of claim 15, wherein said planarizing is chemical mechanical polishing.

26. A method for filling a isolation trench within a silicon semiconductor substrate, the steps comprising:

providing a silicon semiconductor substrate having a pad oxide layer formed thereover;

forming a SiN layer over said pad oxide layer;

etching said SiN layer, said pad oxide layer, and said silicon semiconductor substrate to form an isolation trench within said silicon semiconductor substrate; said isolation trench having a bottom surface and opposing side walls;

thermally growing an undoped silicon glass liner to coat said bottom surface and side walls of said isolation trench;

depositing an undoped silicon oxide layer over said undoped silicon glass liner;

depositing a boron doped silicon oxide layer over said undoped silicon oxide layer and filling said isolation trench;

heating said boron doped silicon oxide layer to reflow said boron doped silicon oxide to fill any void initially formed within said boron doped silicon oxide layer within said isolation trench, thereby eliminating any said void; then chemical mechanical polishing said boron doped silicon oxide layer to form within said trench a planarized gap filling boron doped silicon oxide trench filled layer.

27. The method of claim 26, wherein the concentration of boron in said boron doped silicon oxide layer is between about from 2 wt. % to about 5 wt. %.

28. The method of claim 26, wherein said isolation trench is a shallow isolation trench having a width of less than about 0.26 microns and a depth of from about 0.25 to about 0.4 microns.

29. The method of claim 26, wherein said isolation trench is a shallow isolation trench having a width of about 0.26 microns and a depth of from about 0.25 to about 0.4 microns, wherein said opposing side walls of said isolation trench are from about 75° to about 85° vertical.

30. The method of claim 26, wherein said isolation trench is a shallow isolation trench having a width of less than about 0.25 microns and a depth of from about 0.25 to about 0.45 microns, wherein said shallow isolation trench has a top width of less than 0.26 microns.

31. The method of claim 26, wherein said isolation trench is a shallow isolation trench having a width of about 0.25 microns and a depth of from about 0.25 to about 0.45 microns, wherein said shallow isolation trench has a top width of less than about 0.26 microns, wherein said opposing side walls of said isolation trench are greater than about 83° vertical.

32. The method of claim 26, wherein said undoped silicon glass liner has a thickness of from about 350 to about 500 Å.

33. The method of claim 26, wherein said undoped silicon glass liner has a thickness of from about 250 to about 500 Å and said undoped silicon oxide layer has a thickness of less than about 500 Å.

34. The method of claim 26, wherein said heating is from about 950° C. to about 1,100° C. for about 1 hour to about 3 hours.

35. The method of claim 26, wherein said undoped silicon glass liner has a thickness of from about 250 to about 500 Å, said undoped silicon oxide layer has a thickness of less than about 500 Å, and said annealing is at about 1,000° C. for about 2 hours.

36. The method of claim 26, wherein said pad oxide layer has a thickness of from about 100 to 300 Å, and said SiN layer has a thickness of from about 1000 to 2500 Å.

37. The method of claim 26, wherein said pad oxide layer has a thickness of about 100 Å, and said SiN layer has a thickness of about 1700 Å.

* * * * *